(12) United States Patent
Shitagami et al.

(10) Patent No.: US 7,329,987 B2
(45) Date of Patent: Feb. 12, 2008

(54) ORGANIC ELECTROLUMINESCENT DEVICE AND ELECTRONIC APPARATUS

(75) Inventors: Kozo Shitagami, Suwa (JP); Kenji Hayashi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/012,493

(22) Filed: Dec. 16, 2004

(65) Prior Publication Data
US 2005/0189878 A1 Sep. 1, 2005

(30) Foreign Application Priority Data
Mar. 1, 2004 (JP) .............................. 2004-056177

(51) Int. Cl.
*H01J 1/62* (2006.01)
(52) U.S. Cl. .................. 313/512; 313/506; 313/509
(58) Field of Classification Search ................ 313/506, 313/509, 512
See application file for complete search history.

(56) References Cited

U.S. PATENT DOCUMENTS

| | | | |
|---|---|---|---|
| 5,427,858 A * | 6/1995 | Nakamura et al. .......... 428/421 |
| 6,284,342 B1 | 9/2001 | Ebisawa et al. |
| 6,551,724 B2 | 4/2003 | Ishii et al. |
| 6,686,063 B2 | 2/2004 | Kobayashi |
| 6,768,534 B2 | 7/2004 | Iwase et al. |
| 6,933,520 B2 * | 8/2005 | Yamazaki .................... 257/40 |
| 2002/0155320 A1 * | 10/2002 | Park et al. ................... 428/690 |
| 2003/0071570 A1 | 4/2003 | Tamashiro et al. |
| 2004/0004434 A1 | 1/2004 | Nishi et al. |
| 2004/0051690 A1 * | 3/2004 | Chang ........................ 345/92 |
| 2004/0150332 A1 * | 8/2004 | Hwang et al. ............... 313/512 |
| 2005/0174048 A1 | 8/2005 | Matsukaze |
| 2005/0227082 A1 * | 10/2005 | Shimazu et al. ............. 428/413 |
| 2005/0248929 A1 * | 11/2005 | Kawamura et al. ........... 362/84 |

FOREIGN PATENT DOCUMENTS

| | | |
|---|---|---|
| JP | A-62-272497 | 11/1987 |
| JP | A 11-40347 | 2/1999 |
| JP | A 2002-8853 | 1/2002 |
| JP | A 2002-221916 | 8/2002 |
| JP | A 2002-231441 | 8/2002 |
| JP | A-2003-178866 | 6/2003 |
| JP | A-2003-317938 | 11/2003 |
| JP | A-2004-39542 | 2/2004 |
| JP | A-2004-47387 | 2/2004 |

* cited by examiner

*Primary Examiner*—Joseph Williams
*Assistant Examiner*—Bumsuk Won
(74) *Attorney, Agent, or Firm*—Oliff & Berridge, PLC

(57) ABSTRACT

To provide an organic electroluminescent device having a sealing structure in which an adhesive layer and a protective substrate are provided on light-emitting elements, the organic electroluminescent device being capable of emitting display light from the protective substrate and of obtaining higher reliability in a peripheral region in which connecting terminals are provided. The organic electroluminescent device of the present invention comprises an element substrate having organic EL elements on one surface thereof and a protective substrate bonded to the element substrate with an adhesive layer that is provided on the organic EL elements interposed therebetween. A separating member is provided between the protective substrate and the element substrate to uniformly maintain the gap between the two substrates.

17 Claims, 8 Drawing Sheets

ORGANIC ELECTROLUMINESCENT DEVICE AND ELECTRONIC APPARATUS

BACKGROUND

The present invention relates to an organic electroluminescent device and an electronic apparatus.

Conventionally, there have been disclosed electro-optical devices, such as organic electroluminescent (hereinafter, referred to as 'organic EL') display devices, having a structure in which an anode, a hole injecting layer, a light-emitting layer made of an electro-optical material, such as an EL material, a cathode, and the like are formed on a substrate in this order. Organic EL elements constituting the organic EL display device have a problem in that the deterioration of the electro-optical material for forming the light-emitting layer caused by the permeation of water or oxygen and the poor conductivity of the cathode caused by the permeation of water and oxygen shorten the life span of the light-emitting elements.

In order to solve the problem, conventionally, there has been disclosed a sealing structure in which light-emitting elements are formed on a supporting substrate and a surface of the supporting substrate having the light-emitting elements thereon is bonded to a counter substrate by adhesive resin to seal the light-emitting elements (for example, see Patent Document 1). In addition, Patent Document 1 discloses a structure in which black matrix for shielding a region between pixels is provided on the counter substrate for sealing the light-emitting elements, and alignment marks are respectively provided on the surfaces of the counter substrate and the supporting substrate opposite to each other in order to precisely bond the two substrates.

[Patent Document 1] Japanese Unexamined Patent Application Publication No. 2002-221916.

SUMMARY

According to the conventional technique disclosed in Patent Document 1, the light-emitting elements can be surely sealed by the adhesive resin, and the two substrates can be accurately positioned in the plane direction by the alignment marks. However, particularly, in a top-emission type organic EL device in which light is emitted from the counter substrate, since display light passes through the above-mentioned sealing structure, the adhesive resin greatly affects optical characteristics. Therefore, there is a possibility that good display characteristics will not be obtained only by positioning the substrates in the plane direction.

Further, when the conventional organic EL device is mounted in an electronic apparatus as a display unit, connecting terminals with an external circuit are needed. In addition, when the adhesive resin is merely interposed between two substrates, the adhesive resin flows out between the substrates and sticks on the connecting terminals. As a result, the conductivity of the terminals deteriorates, which greatly affects manufacturing yield.

Accordingly, the present invention is designed to solve the above-mentioned problems, and it is an object of the present invention to provide an organic electroluminescent device having a sealing structure in which an adhesive layer and a protective substrate are provided on light-emitting elements, the organic electroluminescent device being capable of emitting good display light from the protective substrate and of preferably obtaining higher reliability in a peripheral region in which connecting elements and the like are provided.

In order to achieve the above object, the present invention provides an organic electroluminescent device comprising: an element substrate having organic EL elements on one surface thereof; and a protective substrate bonded to the element substrate with an adhesive layer interposed therebetween, the adhesive layer being provided on the organic EL elements, wherein a separating member is provided between the protective substrate and the element substrate for maintaining a predetermined gap therebetween.

According to the above-mentioned structure, the protective substrate and the element substrate can be maintained at predetermined positions by the separating member interposed between the protective substrate and the element substrate. Therefore, particularly, in a top-emission type structure in which light of the organic EL elements is emitted from the protective substrate, it is possible to improve the uniformity of display light emitted from the protective substrate.

In the organic electroluminescent device according to the present invention, the separating member is preferably provided at the outside of an element forming region in which the organic EL elements are formed. According to this structure, since the separating member is provided at the outside of the adhesive layer for sealing the organic EL elements, it is possible to prevent the permeation of water and oxygen into the organic EL element by the separating member. Therefore, it is possible to provide an organic electroluminescent device having higher reliability.

In the organic electroluminescent device according to the present invention, the separating member is preferably provided between the element forming region and a region in which connecting terminals constituting a portion connecting with an external apparatus are formed. According to this structure, it is possible to prevent a material for forming the adhesive layer from sticking on the element forming region by the separating member arranged between the adhesive layer and the element forming region. Therefore, it is possible to effectively prevent poor contact caused by the sticking of the forming material on the connecting terminals.

In the organic electroluminescent device according to the present invention, a fitting structure is preferably provided in a contact portion between the separating member and the protective substrate to restrict the movement of the protective substrate in the plane direction. According to this structure, it is possible to accurately position the protective substrate with respect to the element substrate by fitting the separating member to the protective substrate. Therefore, it is possible to improve display characteristics of an organic electroluminescent device and to easily manufacture the device.

In the organic electroluminescent device according to the present invention, the fitting structure preferably comprises a cut-out portion provided in an outer circumferential end portion of the protective substrate and an upper end portion of the separating member fitted to the cut-out portion.

Further, in the organic electroluminescent device according to the present invention, the fitting structure preferably comprises a cut-out portion provided in an upper end portion of the separating member and an edge portion of the protective substrate fitted to the cut-out portion.

Furthermore, in the organic electroluminescent device according to the present invention, the fitting structure preferably comprises a groove provided in a surface of the protective substrate facing the element substrate and an upper end portion of the separating member fitted to the groove.

According to these fitting structures, it is possible to accurately position the protective substrate with respect to the element substrate with a simple structure. Therefore, is possible to manufacture a high-performance organic electroluminescent device at a low cost.

In the organic electroluminescent device according to the present invention, the separating member is preferably formed substantially in a rectangular frame shape in plan view. According to this structure, since the adhesive layer is surrounded by the separating member, it is possible to prevent the material for forming the adhesive layer from sticking on a circumferential portion of the element substrate. In addition, it is possible to effectively prevent the permeation of water into the organic EL elements by the separating member.

In the organic electroluminescent device according to the present invention, air bubble removing means is preferably provided in the separating member or the protective substrate to prevent the generation of air bubbles in the adhesive layer when the protective substrate is bonded to the element substrate with the adhesive layer interposed therebetween. The air bubble removing means is a communicating hole through which the adhesive layer communicates with the outside of the separating member.

According to this structure, it is possible to effectively prevent the deterioration of display characteristics caused by the generation of gas bubbles between the adhesive layer and the protective substrate, thereby manufacturing an organic electroluminescent device capable of displaying a high-quality image at high yield.

Furthermore, an electronic apparatus of the present invention comprises any one of the above-mentioned organic electroluminescent devices. According to this structure, it is possible to provide an electronic apparatus equipped with a display unit that has high reliability and is capable of displaying a high-quality image.

DETAILED DESCRIPTION OF EMBODIMENTS

Hereinafter, embodiments of the present invention will be described with reference to the accompanying drawings. The embodiments to be described below are just examples of the present invention, but the present invention is not limited thereto. That is, various modifications and variations thereof can be made without departing from the scope of the present invention. In addition, in the figures, which will be referred to in the following description, each layer or each member has a different reduced scale so as to be easily viewed in the figures.

First Embodiment

Figure 1:
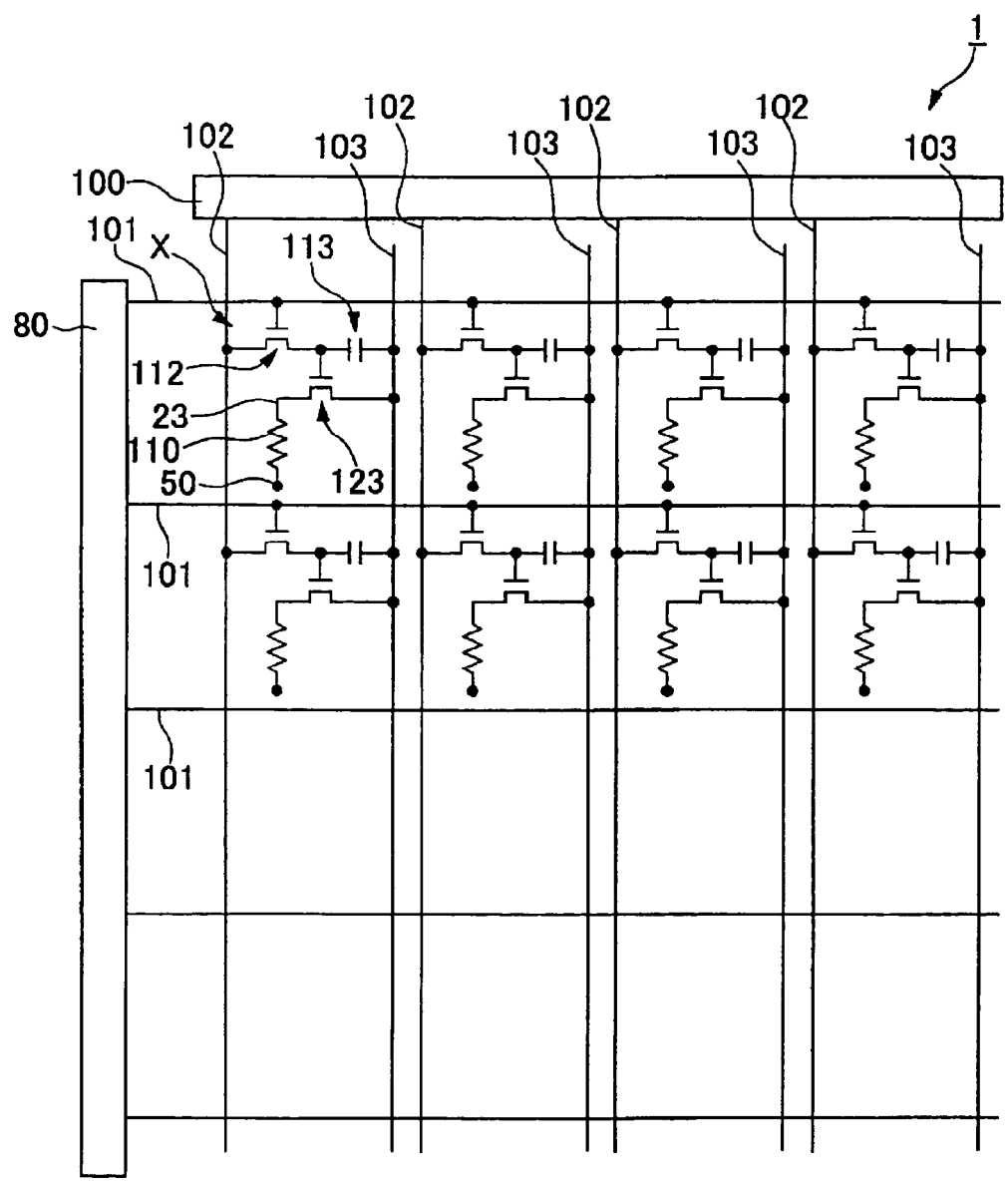
FIG. 1 is a circuit diagram of an organic EL device according to a first embodiment of the present invention.

FIG. 1 is a circuit diagram illustrating the structure of wiring lines of an organic EL device (an organic electroluminescent device) according to a first embodiment of the present invention. An organic EL device 1 is an active matrix type in which thin film transistors (TFTs) are used as switching elements, and comprises a plurality of scanning lines 101, a plurality of signal lines 102 extending in the direction perpendicular to the scanning lines 101, and a plurality of power lines 103 extending parallel to the signal lines 102. Pixel regions X are respectively formed in the vicinities of the intersections of the scanning lines 101 and the signal lines 102. The signal lines 102 are connected to a data line driving circuit 100 comprising a shift register, a level shifter, video lines, an analog switch, and the like. Further, the scanning lines 101 are connected to scanning line driving circuits 80 each comprising a shift register, a level shifter, and the like.

Furthermore, each of the pixel regions X is provided with a switching TFT 112 having a gate electrode to which a scanning signal is supplied through the scanning line 101, a storage capacitor 113 for holding an image signal supplied from the signal line 102 through the switching TFT 112, a driving TFT 123 having a gate electrode to which the image signal held in the storage capacitor 113 is supplied, a pixel electrode 23 to which a driving current is supplied from the power line 103 when electrically connected to the power line 103 through the driving TFT 123, and a functional layer 110 interposed between the pixel electrode 23 and a cathode (a counter electrode) 50. Further, the pixel electrode 23, the cathode 50, and the functional layer 110 constitute a light-emitting element, that is, an organic EL element.

In the organic EL device 1 having the above-mentioned structure, when the scanning line 101 is driven to turn on the switching TFT 112, the potential of the signal line 102 at that time is held in the storage capacitor 113, and an on or off state of the driving TFT 123 is determined according to the state of the storage capacitor 113. In addition, current flows from the power line 103 to the pixel electrode 23 through a channel of the driving TFT 123, and the current flows toward the common cathode 50 through the functional layer 110. Then, the functional layer 110 emits light corresponding to the amount of current flowing therethrough.

Figure 2:
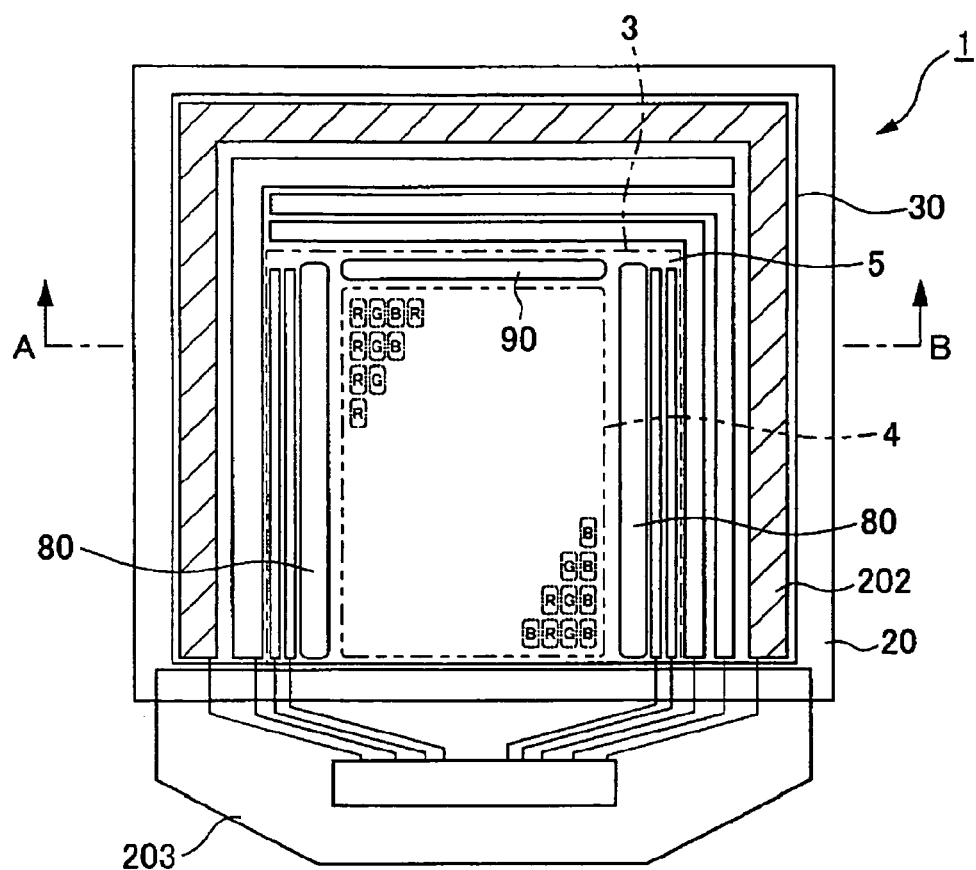
FIG. 2 is a plan view illustrating the structure of the organic EL device.
Figure 3:
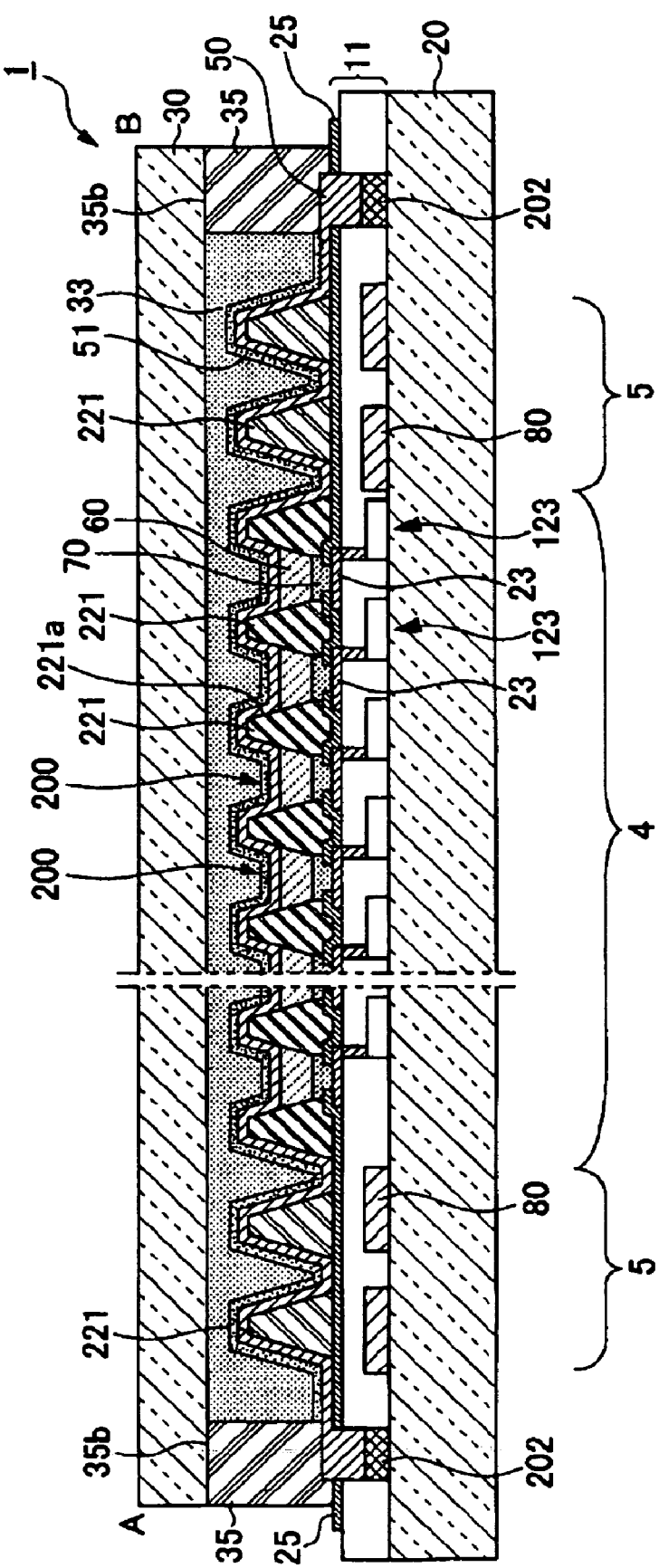
FIG. 3 is a cross-sectional view taken along the line A-B of FIG. 2.

Next, a concrete aspect of the organic EL device 1 according to the present embodiment will be described with reference to FIGS. 2 and 3. FIG. 2 is a plan view schematically illustrating the structure of the organic EL device 1. FIG. 3 is a cross-sectional view taken along the line A-B of FIG. 2.

As shown in FIG. 2, the organic EL device 1 of the present embodiment comprises an element substrate 20, a pixel electrode region (not shown) in which the pixel electrodes connected to the switching TFTs (not shown) are arranged in a matrix, and a pixel portion 3 (a region surrounded by an one-dot chain line in FIG. 2) that has substantially a rectangular shape in plan view and is located at least on the pixel electrode region. The pixel portion 3 of the present embodiment is divided into an element forming region 4 (a region surrounded by a two-dot chain line in FIG. 2) located at the center thereof and a dummy region 5 (a region positioned between the one-dot chain line and the two-dot chain line) located in the circumference of the element-forming region 4.

In the element-forming region 4, display regions R, G, and B each having the pixel electrode are regularly arranged in the directions parallel to and perpendicular to the line A-B, that is, in a matrix in plan view. In addition, the scanning line driving circuits 80 are arranged on both sides of the element-forming region 4 in the horizontal direction of FIG. 2. The scanning line driving circuits 80 are provided below the dummy region 5.

Further, a test circuit 90 is arranged on the upside of the element-forming region 4 in FIG. 2, and the test circuit 90 is also arranged below the dummy region 5, similar to the scanning line driving circuits 80. The test circuit 90 is a circuit for testing the operating conditions of the organic EL device 1 and comprises, for example, test information output means (not shown) for outputting test results to the outside. The test circuit 90 is constructed to test the quality and defects of a display device in manufacturing processes or in shipment.

A voltage for driving the scanning line driving circuits 80 and the test circuit 90 is supplied from a predetermined power source through signal lines (not shown). In addition, drive control signals and the driving voltage are respectively transmitted or supplied from a predetermined main driver for controlling the operation of the organic EL device 1 to these scanning line driving circuits 80 and the test circuit 90 through the signal lines (not shown). Further, in this case, the drive control signal is a command signal output from the main driver related to the control when the scanning line driving circuits 80 and the test circuit 90 output signals.

Furthermore, cathode wiring lines 202 are provided at the outside of the pixel portion 3 and are electrically connected to the cathode 50. A transparent protective substrate 30 is provided so as to cover at least a region in which the cathode 50 is formed. As shown in FIG. 3, the protective substrate 30 is provided opposite to the element substrate 20 with a plurality of light-emitting elements constituting the element forming region 4 interposed therebetween, which will be described later.

Next, in a cross-sectional structure shown in FIG. 3, the organic EL device 1 is provided with a plurality of organic EL elements 200 each having the pixel electrode (a first electrode) 23, an organic light-emitting layer 60, and the cathode (a second electrode) 50 that are formed on the element substrate 20. In addition, an adhesive layer 33 formed to cover the organic EL elements 200 and the protective substrate 30 arranged on the adhesive layer 33 are provided on the plurality of organic EL elements 200, thereby forming a sealing structure.

Further, the organic light-emitting layer 60 is used as the main layer constituting the functional layer 110 shown in FIG. 1, but a layer obtained by forming a hole injecting layer, a hole transporting layer, an electron injecting layer, an electron transporting layer, a hole block layer, and an electron block layer between two electrodes can be used. In case of the organic EL element 200 according to the present embodiment, a hole injecting/transporting layer 70 is provided between the organic light-emitting layer 60 and the pixel electrode 23.

In case of a so-called top-emission type organic EL device, display light is emitted from the protective substrate 30 opposite to the element substrate 20. Therefore, a transparent substrate or an opaque substrate can be used as the element substrate 20. A substrate obtained by performing an insulating process, such as surface oxidation, on a metal sheet, such as stainless steel, or ceramic, such as alumina, can be used as the opaque substrate. In addition, a substrate made of thermosetting resin, thermoplastic resin, or a film thereof (a plastic film) can be used as the opaque substrate in consideration of impact resistance and weight reduction.

Moreover, a circuit unit 11 comprising the driving TFTs 123 for driving the pixel electrodes 23 is formed on the element substrate 20, and a plurality of the organic EL elements 200 is arranged thereon. As shown in FIG. 3, the organic EL element 200 is formed by laminating the pixel electrode 23 functioning as an anode, the hole injecting/transporting layer 70 for injecting/transporting holes from the pixel electrode 23, the organic light-emitting layer 60 including an organic EL material, which is one of electro-optical materials, and the cathode 50 in this order. In such a laminated structure, light is emitted from the organic EL element 200 by the coupling of the holes injected from the hole injecting/transporting layer 70 and the electrons supplied from the cathode 50 in the organic light-emitting layer 60.

Since the pixel electrode 23 is a top emission type in the present embodiment, it is not necessary for the pixel electrode to be made of a transparent material. That is, the pixel electrode 23 is made of an appropriate conductive material, for example, a metallic material. It goes without saying that the pixel electrode 23 may be made of a transparent conductive material, such as ITO (Indium Tin Oxide).

The hole injecting/transporting layer 70 may be made of, for example, a polythiophene derivative, a polypyrrole derivative, or a material doped with one of these derivatives. More specifically, the hole injecting/transporting layer 70 may be made of a dispersant of 3,4-polyethylenedioxythiophene/polystylenesulfonic acid (PEDOT/PSS).

The organic light-emitting layer 60 can be made of a well-known luminescent material capable of emitting phosphorescence or fluorescence. More specifically, a polysilane-based material, such as a (poly) fluorine derivative (PF), a (poly) paraphenylenevinylene derivative (PPV), a polyphenylene derivative (PP), a polyparaphenylene derivative (PPP), polyvinylcarbazole (PVK), a polythiophene derivative, or polymethylphenylsilane (PMPS), can be preferably used as the luminescent material.

Further, a material obtained by doping the polymer material with a high molecular material, such as perylene-based pigment, coumarin-based pigment, or rhodamine-based pigment, or a low molecular material, such as rubrene, perylene, 9,10-diphenylanthracene, tetraphenylbutadiene, Nile red, coumarin 6, or quinacridone, can be used.

However, instead of the above-mentioned high molecular materials, well-known low molecular materials can be used.

Furthermore, if necessary, an electron injecting layer made of a metallic material or a metallic compound having calcium, magnesium, lithium, sodium, strontium, barium or cesium as the main ingredient may be formed on the organic light-emitting layer 60.

In the present embodiment, the hole injecting/transporting layer 70 and the organic light-emitting layer 60 are surrounded by an inorganic insulating layer 25 and a partitioning member 221 that are formed on the element substrate 20 in a lattice shape in plan view. That is, the hole injecting/transporting layer 70 and the organic light-emitting layer 60 arranged in an opening 221a surrounded by these members is an element layer constituting a single organic EL element 200. In addition, the partitioning member 221 extends to the scanning line driving circuit 80 provided therebelow through the insulating layer, and the opening 221a of the partitioning member 221 arranged in the dummy region 5 can be used as a dummy pixel at the time of the formation of the functional layer.

However, the inorganic insulating layer 25 has an area larger than the total area of the element forming region 4 and the dummy region 5 and is formed to cover the surface of the element substrate 20 including its outer circumferential portion.

The organic light-emitting layer 60 and the hole injecting/transporting layer 70 are formed by a droplet discharging method (an inkjet method) in which a trace of liquid is selectively applied into the openings 221a of the partitioning member 221. A well-known method as disclosed in Patent Document can be used as the droplet discharging method. In addition, when, for example, the organic light-emitting layer 60 and the like are formed by the droplet discharging method, a trace of liquid is applied into the openings 221a of the partitioning member 221. Therefore, while droplets are sequentially being discharged into the openings 221a, the liquid materials that have already been applied will dry, resulting in the irregularities of the liquid materials. Contrary to this method, in the organic EL device according to the present embodiment, the openings 221a arranged in the dummy region 5 among the openings 221a provided in the partitioning member 221 can be used as the dummy pixels. Therefore, since the liquid material is discharged into the openings 221a constituting the dummy pixels, it is possible to prevent the generation of the dry irregularity and thus to manufacture organic EL elements 200 having uniform element characteristics.

The cathode 50 is formed on the element substrate 20 so as to cover the upper surfaces of the organic light-emitting layer 60 and the partitioning member 221 and a wall surface constituting an outer side of the partitioning member 221. As shown in FIG. 3, the cathode 50 extends from the outer side of the partitioning member 221 to a circumferential region of the element substrate 20 to be connected to the cathode wiring lines 202. The cathode wiring lines 202 are electrically connected to a flexible substrate 203 together with other wiring lines (see FIG. 2), and the cathode 50 is connected to a driving IC (a driving circuit) mounted on the flexible substrate 203 through the cathode wiring lines 202.

Since the cathode 50 is a top emission type in the present embodiment, it is necessary to form the cathode 50 with a transmissive conductive material. In general, ITO is used as the transmissive conductive material, and other transparent conductive materials may also be used.

A cathode protecting layer 51 may be further formed on the cathode 50 (on the side of the protective substrate 30). The cathode protecting layer 51 functions to prevent the corrosion of the cathode 50 in manufacturing processes and can be made of an inorganic compound, such a silicon compound. It is possible to prevent the corrosion of the cathode 50 caused by contact with oxygen, water, an organic material, and the like by covering the cathode 50 with the cathode protecting layer 51 made of an inorganic compound.

Further, the cathode protecting layer 51 can be made of a silicon compound, that is, a silicon nitride, a silicon oxynitride or a silicon oxide, using a high-density plasma film-forming method. Alternatively, the cathode protecting layer 51 can be made of, for example, alumina, tantalum oxide, titanium oxide, or ceramic other than the silicon compounds. The cathode protecting layer 51 is preferably formed with a thickness of 10 nm to 300 nm. When the thickness is below 10 nm, through holes can be partially formed therein due to the defects in a film or a variation in thickness, resulting in the damage of barrier properties. On the other side, when the thickness exceeds 300 nm, the layer is split by stress, which results in the damage of the cathode 50.

The adhesive layer 33 is provided on the cathode 50 so as to cover an area larger than the area of the partitioning member 221, and the protective substrate 30 is formed on the adhesive layer 33. The adhesive layer 33 is held inside the pixel portion 3 by a separating member 35 provided in an outer circumferential portion of the substrate 20 and the protective substrate 30 brought into contact with the upper end surface of the separating member 35. In addition, the protective substrate 30 is bonded to the element substrate 20 by the adhesive layer 33.

The adhesive layer 33 is made of, for example, a resin material, such as urethane-based resin, acryl-based resin, epoxy-based resin, or polyolefin-based resin, and functions as an adhesive made of a material having a low glass transition point more flexible than the protective substrate 30, which will be described later. The resin material is preferably added with a silane coupling agent or alkoxysilane, which improves the adhesion between the adhesive layer 33 and the protective substrate 30, thereby improving buffering performance with respect to a mechanical impact. In addition, the adhesive layer 33 is formed by applying a liquid resin material to the element substrate 20 using a dispenser and by solidifying the material in a state in which the protective substrate 30 is bonded thereto.

Further, the adhesive layer 33 has a function for preventing the permeation of water and oxygen into its inside in addition to a function for adhering the protective substrate 30. Therefore, it is possible to prevent the permeation of water and oxygen into the cathode 50 or the organic light-emitting layer 60 to suppress the deterioration of the cathode 50 or the organic light-emitting layer 60.

Furthermore, since the present embodiment adopts a top emission type, the adhesive layer 33 is made of a transmissive material. Therefore, the material or thickness of the adhesive layer 33 is appropriately adjusted such that transmittance in the range of a visible ray is, for example, 80% or more.

The protective substrate 30 and the adhesive layer 33 constitute a sealing structure for sealing the organic EL elements 200. The protective substrate 30 preferably has any one of pressure resistance, abrasion resistance, an external light antireflection property, a gas barrier property, and a UV shielding property. More specifically, a plastic film in which a DLC (diamond-like carbon) layer, a silicon oxide layer, a titanium oxide layer, and the like are formed on a glass substrate or an outmost surface is preferably used as the protective substrate 30.

In the organic EL device of the present embodiment, in case of a top emission type, it is necessary to form both the protective substrate 30 and the adhesive layer 33 with a transmissive material. However, in case of a bottom emission type, it is not necessary to form both the protective substrate 30 and the adhesive layer 33 with a transmissive material.

Figure 4:
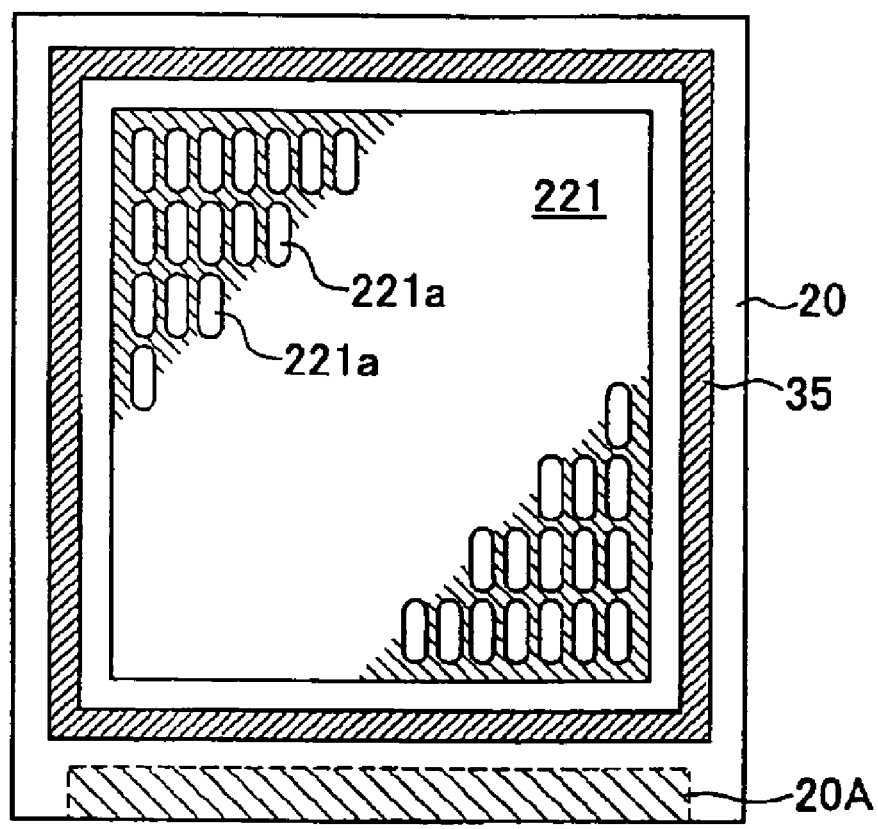
FIG. 4 is a plan view illustrating a substrate supporting structure.

The separating member 35 is provided in a region on the cathode wiring line 202 located at the outside of the partitioning member 221. The separating member 35 is interposed between the element substrate 20 and the protective substrate 30 such that two substrates are separated from each other by a predetermined distance. Here, FIG. 4 is a plan view illustrating the shape of the separating member 35. As shown in FIG. 4, the separating member 35 has a rectangular shape in plan view and is arranged to surround the partitioning member 221.

As described above, the adhesive layer 33 is formed by applying a liquid forming material and by solidifying the material. However, in the organic EL device according to the present embodiment, since the forming material is applied into only a region surrounded by the separating member 35, the separating member 35 functions as a bank member for sealing the adhesive layer 33 at the inside thereof when adhering the protective substrate 30.

In other words, it is possible to prevent the forming material from spreading to the circumferential portion of the element substrate 20 at the time of the adhesion of the protective substrate 30 and thus to prevent the forming material from sticking on a terminal region 20A in which connecting terminals are formed. Therefore, it is possible to prevent poor contact with the connecting terminals, thereby achieving an organic EL device having higher reliability.

The separating member 35 is made of an organic material, such as acryl resin, or an inorganic material, such as silicon oxide, and is patterned into a predetermined shape by a photolithography method or a printing method. In addition, the separating member 35 functions to uniformly maintain the gap between the element substrate 20 and the protective substrate 30 and is formed with a uniform height in the forming region such that the height thereof is in the range of 50 μm to 1 mm. In order to prevent the damage of the organic EL elements 200 caused by the mixture of particles at the time of the adhesion of the protective substrate 30, the protective substrate 30 and the organic EL elements 200 are preferably separated from each other by a predetermined distance. Therefore, the height of the separating member 35 is larger than that of the partitioning member 221. For example, the height is preferably about 20 μm or more. In addition, when the height is 50 μm or more, it is possible to surely prevent the damage of the organic EL elements 200.

In the organic EL device of the present embodiment having the above-mentioned structure, since the separating member 35 is interposed between the element substrate 20 and the protective substrate 30, it is possible to separate the protective substrate 30 from the element substrate 20 by a predetermined distance, thereby achieving high-quality display. That is, in the top-emission type organic EL device 1, light passing through the adhesive layer 33 and the protective substrate 30 formed on the organic EL elements 200 is display light. However, since the thickness of the adhesive layer 33 provided on the organic EL elements 200 is uniformly maintained over the entire surface of the element-forming region 4 by the separating member 35, transmitted light is uniformly absorbed or refracted in the element-forming region 4 by the adhesive layer 33. Therefore, the display light emitted from the protective substrate 30 has uniform brightness and chromaticity, and thus it is possible to obtain high-quality display.

Figure 5:
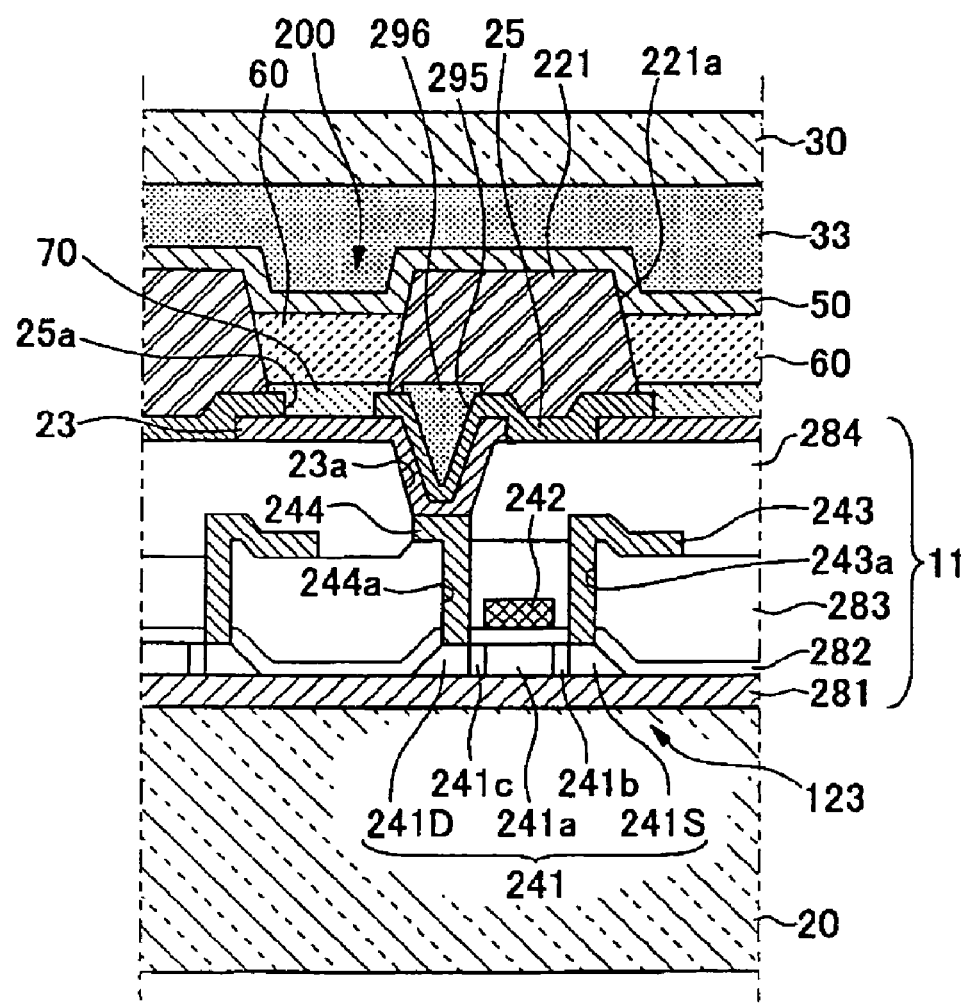
FIG. 5 is an enlarged sectional view partially illustrating the principal part of FIG. 2.

Next, a sectional structure of the organic EL device 1 will be described in detail. As shown in FIG. 3, the circuit unit 11 is provided on a lower layer in which the pixel electrodes 23 and the like are formed. However, a detail structure thereof is omitted in FIG. 3, but the detailed structure of the circuit unit 11 will be described with reference to a partially sectional view shown in FIG. 5.

A base protective layer 281 whose main ingredient is $SiO_2$ is formed on the surface of the element substrate 20 as a base, and a silicon layer (a semiconductor layer) 241 is formed thereon. A gate insulating layer 282 whose main ingredient is $SiO_2$ and/or SiN is formed on the element substrate 20 including the surface of the silicon layer 241.

A region of the silicon layer 241 overlapping a gate electrode 242 with the gate insulating layer 282 interposed therebetween is a channel region 241a. The gate electrode 242 constitutes a portion of the scanning line 101 (not shown). Meanwhile, a first interlayer insulating layer 283 is formed on the surface of gate insulating layer 282 covering the silicon layer 241 so as to form the gate electrode 242. The first interlayer insulating layer 283 is an insulating film mainly made of a silicon compound, such as a silicon oxide or a silicon nitride, and can be formed by a plasma CVD method using, for example, a mixed gas of monosilane and dinitrogen monoxide, TEOS (tetraethoxysilane, $Si(OC_2H_5)_4$) and oxygen, and disilane and ammonia as a raw material gas.

Further, a lightly doped source region 241b and a heavily doped source region 241S are provided on a source side of the channel region 241a in the silicon layer 241, and a lightly doped drain region 241c and a heavily doped drain region 241D are provided on a drain side of the channel region 241a. That is, the driving TFT 123 is a thin film transistor having a so-called LDD (Lightly Doped Drain) structure. The heavily doped source region 241S is connected to a source electrode 243 through a contact hole 243a passing through the gate insulating layer 282 and the first interlayer insulating layer 283. The source electrode 243 constitutes a portion of the power line 103 (see FIG. 1, and the power line extends to the source electrode 243 in the direction perpendicular to the paper in FIG. 5). Meanwhile, the heavily doped drain region 241D is connected to a drain electrode 244 formed of the same layer as the source electrode 243 through a contact hole 244a passing through the gate insulating layer 282 and the first interlayer insulating layer 283.

A planarized insulating film 284 mainly made of a silicon compound having a gas barrier property, such as a silicon nitride, a silicon oxynitride, or a silicon oxide, is formed on the first interlayer insulating layer 283 having the source electrode 243 and the drain electrode 244 therein. The planarized insulating film 284 may be composed of a wiring line planarizing layer made of, for example, acryl resin and a silicon compound layer made of, for example, a silicon nitride (SiN) or a silicon oxide ($SiO_2$). In addition, the pixel electrode 23 made of ITO is formed on the surface of the planarized insulating film 284 so as to be connect to the drain electrode 244 through a contact hole 23a provided in the planarized insulating film 284. That is, the pixel electrode 23 is electrically connected to the heavily doped drain region 241D of the silicon layer 241 through the drain electrode 244.

Further, when the pixel electrode 23 is formed in the contact hole 23a, a concave portion 295 caused by the shape of the contact hole 23a is formed. Therefore, an organic planarizing layer 296 is formed on the concave portion 295 to fill up the concave portion 295, thereby planarizing the concave portion 295. The organic planarizing layer 296 is preferably made of, for example, acryl resin or an organic silicon compound. As such, by planarizing the base of the partitioning member 221, it is possible to easily planarize the cathode 50 and the adhesive layer 33 covering the partitioning member 221, thereby improving sealing performance.

Furthermore, the TFTs (TFTs for driving circuits) included in the scanning line driving circuits 80 and the test circuit 90, for example, N-channel type or P-channel type TFTs constituting inverters included in the shift registers of these driving circuits each can have almost the same structure as the driving TFT 123 except that they are not connected to the pixel electrodes 23.

The pixel electrode 23, the inorganic insulating layer 25, and the partitioning member 221 are provided on the surface of the planarized insulating film 284 in which the pixel electrode 23 is formed. The inorganic insulating layer 25 is a thin film made of an inorganic material, such as $SiO_2$, and the partitioning member 221 is made of an organic material, such as acryl resin or polyimide. In addition, an opening 25a provided in the inorganic insulating layer 25 is formed on the pixel electrode 23, and the hole transporting layer 70 and the organic light-emitting layer 60 are sequentially formed at the inside of an opening 221a to be surrounded by the partitioning member 221 on the opening 25a.

In the above-mentioned structure, the components between the element substrate 20 and the planarized insulating film 284 constitute the circuit unit 11.

Here, in the organic EL device 1 of the present embodiment, for color display, the respective organic light-emitting layers 60 are formed such that their emission wavelength bands correspond to the primary three colors (R, G, and B), respectively (see FIG. 1). For example, as the organic light-emitting layers 60, a red organic light-emitting layer corresponding to a red emission wavelength band, a green organic light-emitting layer corresponding to a green emission wavelength band, and a blue organic light-emitting layer corresponding to a blue emission wavelength band are respectively provided in the corresponding display regions R, G, and B, and these display region R, G, and B constitute one pixel for color display. In addition, black matrix (BM) (not shown) is formed, for example, between the partitioning member 221 and the inorganic insulating layer 25 in the boundaries between the respective color display regions by sputtering metallic chrome.

Second Embodiment

Figure 6A:
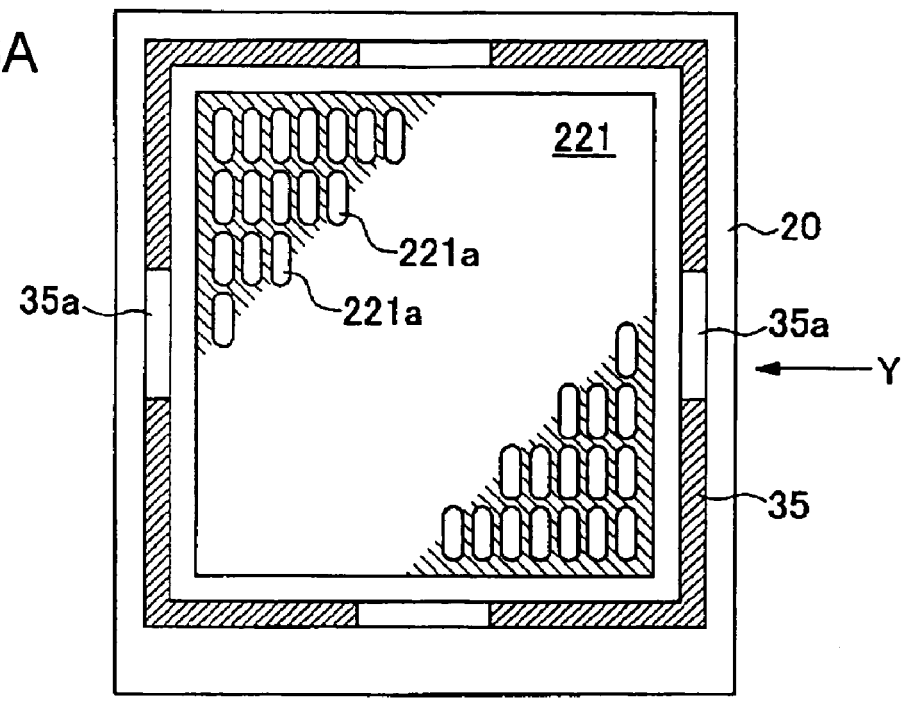
FIG. 6 is an explanatory view illustrating an organic EL device according to a second embodiment of the present invention.
Figure 6B:
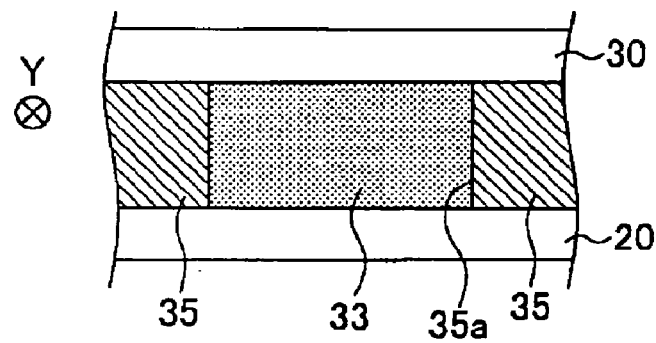
Figure 6C:
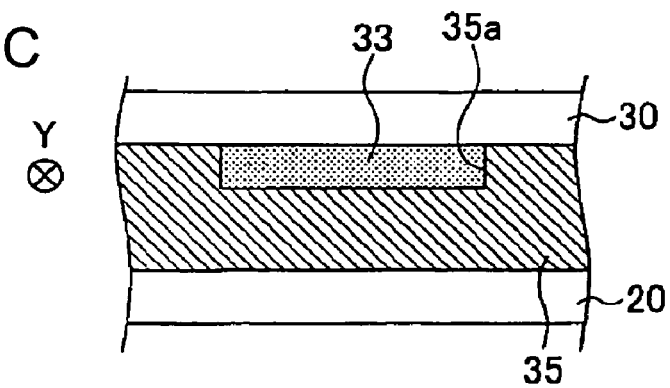

Next, a second embodiment of the present invention will be described with reference to FIG. 6. FIG. 6 is a plan view illustrating the structure of an organic EL device according to the second embodiment. FIG. 6(*a*) corresponds to FIG. 4 in the first embodiment, and FIG. 6(*b*) is a partial side view of the organic EL device as seen from the Y direction of FIG. 6(*a*).

As shown in FIG. 6(*a*), in the organic EL device according to the second embodiment, the shape of the separating member 35 arranged to surround the partitioning member 221 differs from that in the first embodiment. More specifically, in the separating member 35 provided along the respective sides of the element substrate 20, a portion of each side of the separating member 35 is cut out, and a communicating hole 35a is formed in each of the cut-out portions such that the outside of the separating member 35 communicates with the adhesive layer 33 through the communicating hole 35a.

Further, the organic EL device 1 of the second embodiment has the same structure as that of the first embodiment except for the structure of the separating member 35. Therefore, in FIG. 6, the same components as those in FIGS. 1 to 5 have the same reference numerals.

In the organic EL device according to the present embodiment, since the communicating holes 35a are provided in the separating member 35, it is possible to improve the yield of products when forming a sealing structure composed of the adhesive layer 33 and the protective substrate 30 on the element substrate 20. That is, when manufacturing the organic EL device having the above structure, the adhesive layer 33 is applied to a region surrounded by the separating member 35, and then the protective substrate 30 is bonded thereto. At this time, there is a possibility that air bubbles will be generated between the adhesive layer 33 and the protective substrate 30. Therefore, when the communicating holes 35a are provided, it is possible to discharge the air bubbles to the outside through the communicating holes 35a, functioning as air bubble removing means. Thus, it is possible to prevent the deterioration of display characteristics caused by the air bubbles and thus to improve the manufacturing yield of organic EL devices. Further, when a material for forming the adhesive layer 33 is excessively applied, a surplus forming material may overflow the separating member 35 when bonding the protective substrate 30. However, when the communicating holes 35a are provided, it is possible to prevent the surplus forming material from overflowing into the outside. As a result, it is possible to increase a margin with respect to the applied amount of the forming material and to more easily manufacture the organic EL device.

As shown in FIG. 6(*b*), the communicating hole 35a (the air bubble removing means) is formed by entirely cutting out a portion of the separating member 35 in the height direction. However, the shape of the communicating hole 35a is not limited thereto, but can be formed in various shapes. For example, as shown in FIG. 6(*c*), the communicating hole 35a may be formed by partially cutting out a portion of the separating member 35 facing the protective substrate 30 in a rectangular shape in side view. In order to prevent the forming material from overflowing into the terminal region (not shown) in which the connecting terminals are formed when bonding the protective substrate 30, it is preferable that the communicating hole 35a be formed in regions other than the terminal region 20A (not shown). According to this structure, it is possible to prevent poor contact with connecting terminals, thereby achieving an organic EL device having higher reliability.

Third Embodiment

Figure 7:
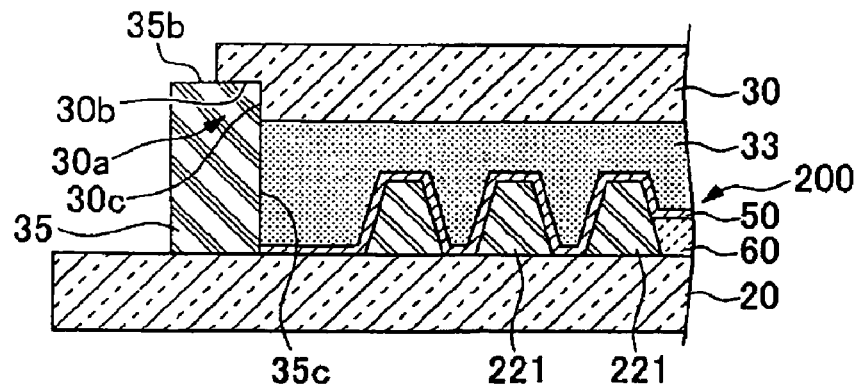
FIG. 7 is a cross-sectional view illustrating a substrate supporting structure according to a third embodiment of the present invention.

Next, a third embodiment of the present invention will be described with reference to FIG. 7. FIG. 7 is an enlarged sectional view illustrating a partial section of an organic EL device according to the present embodiment. The organic EL device of the present embodiment is characterized in that a fitting structure is provided in a contact portion between the protective substrate 30 and the separating member 35, and other constructions of the second embodiment are the same as those of the first embodiment. Therefore, in FIG. 7, the same components as those in FIGS. 1 to 5 have the same reference numerals.

As shown in FIG. 7, in the organic EL device of the present embodiment, a cut-out portion 30a is provided in an edge portion of a surface of the protective substrate 30 facing the element substrate 20, and an inner side of an upper end portion of the separating member 35 provided on the element substrate 20 is fitted to the cut-out portion 30a. Such a fitting structure enables the organic EL device of the present embodiment to uniformly maintain the gap between the protective substrate 30 and the element substrate 20 and to suppress the deviation of the protective substrate 30 in the plane direction. That is, a stepped surface 30b facing the cut-out portion 30a provided in the protective substrate 30 comes into contact with the an upper portion 35b of the separating member 35, so that the movement of the protective substrate 30 in the thickness direction is restricted. In addition, a side end surface 30c facing the cut-out portion 30a comes into contact with an inner side surface 35c of the separating member 35, so that the movement of the protective substrate 30 in the plane direction is restricted. Therefore, the protective substrate 30 is accurately located with respect to the element substrate 20 in the thickness direction and the plane direction. Thus, when a forming material for the adhesive layer 33 is applied to the element substrate 20 and the protective substrate 30 is then bonded thereto, it is possible to easily performing the positioning of two substrates only by fitting the protective substrate 30 to the separating member 35 provided on the element substrate 20. The protective substrate 30 is composed of a glass substrate or a plastic film, and the cut-out portion 30a is formed by a polishing process, such as sandblast. Therefore, according to the present embodiment, there is an advantage in that the protective substrate 30 can be precisely formed without damaging its outward appearance.

Fourth Embodiment

Figure 8:
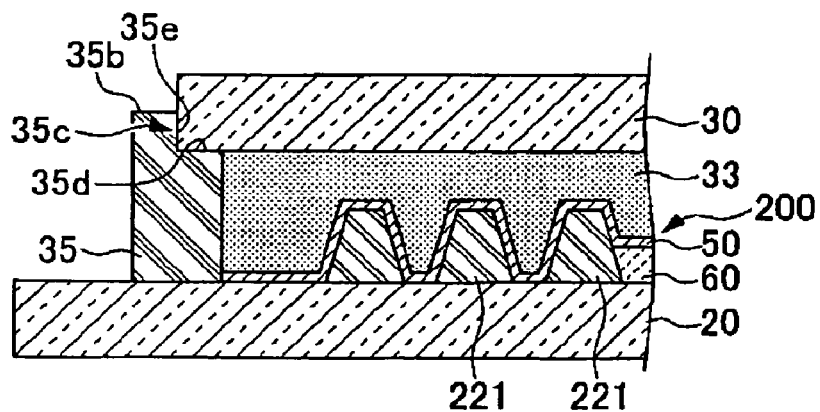
FIG. 8 is a cross-sectional view illustrating a substrate supporting structure according to a fourth embodiment of the present invention.

Next, a fourth embodiment of the present invention will be described with reference to FIG. 8. FIG. 8 is an enlarged sectional view illustrating a partial section of an organic EL device according to the present embodiment. The organic EL device of the present embodiment is characterized in that a fitting structure is provided in a contact portion between the protective substrate 30 and the separating member 35, and other constructions of the fourth embodiment are the same as those of the first embodiment. Therefore, in FIG. 8, the same components as those in FIGS. 1 to 5 have the same reference numerals.

As shown in FIG. 8, in the organic EL device of the present embodiment, a cut-out portion 35c is provided in an inner side of an upper end portion of the separating member 35 provided on the element substrate 20, and an edge portion of the protective substrate 30 facing the element substrate 20 is fitted to the cut-out portion 35c. Such a fitting structure enables the organic EL device of the present embodiment to uniformly maintain the gap between the protective substrate 30 and the element substrate 20 and to suppress the deviation of the protective substrate 30 in the plane direction. That is, a stepped surface 35d facing the cut-out portion 35c provided in the separating member 35 comes into contact with an edge portion 35b of a lower surface of the protective substrate 30, so that the movement of the protective substrate 30 in the thickness direction is restricted. In addition, an inner end surface 35e facing the cut-out portion 35c comes into contact with a side end surface of the protective substrate 30, so that the movement of the protective substrate 30 in the plane direction is restricted. Therefore, the protective substrate 30 is accurately located with respect to the element substrate 20 in the thickness direction and the plane direction. Thus, when the forming material for the adhesive layer 33 is applied to the element substrate 20 and the protective substrate 30 is then bonded thereto, it is possible to easily perform the positioning of two substrates only by fitting the protective substrate 30 to the separating member 35 provided on the element substrate 20. Further, according to the present embodiment, since no process is performed on the protective substrate 30, there is an advantage in that the mechanical strength and sealing performance of the protective substrate 30 do not deteriorate.

Fifth Embodiment

Figure 9:
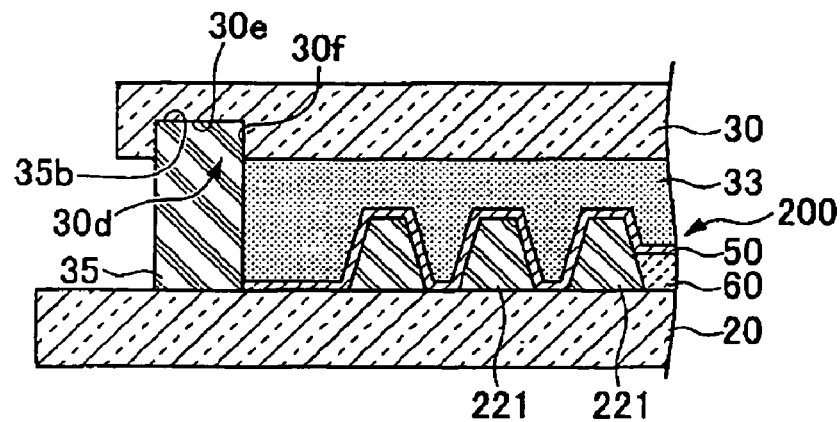
FIG. 9 is a cross-sectional view illustrating a substrate supporting structure according to a fifth embodiment of the present invention.

Next, a fifth embodiment of the present invention will be described with reference to FIG. 9. FIG. 9 is an enlarged sectional view illustrating a partial section of an organic EL device according to the present embodiment. The organic EL device of the present embodiment is characterized in that a fitting structure is provided in a contact portion between the protective substrate 30 and the separating member 35, and other constructions of the fifth embodiment are the same as those of the first embodiment. Therefore, in FIG. 9, the same components as those in FIGS. 1 to 5 have the same reference numerals.

As shown in FIG. 9, in the organic EL device of the present embodiment, a fitting groove (a cut-out portion) 30d is provided in a circumferential portion of an inner surface (a surface facing the element substrate 20) of the protective substrate 30, and an upper end portion of the separating member 35 is fitted to the fitting groove 30d. Such a fitting structure enables the organic EL device of the present embodiment to uniformly maintain the gap between the protective substrate 30 and the element substrate 20 and to suppress the deviation of the protective substrate 30 in the plane direction. That is, a bottom surface 30e of a stepped portion facing the fitting groove 30d that is provided in the protective substrate 30 comes into contact with an upper portion 35b of the separating member 35, so that the movement of the protective substrate 30 in the thickness direction is restricted. In addition, an inner wall surface 30f facing the fitting groove 30d comes into contact with a side surface of the separating member 35, so that the movement of the protective substrate 30 in the plane direction is restricted. Therefore, the protective substrate 30 is accurately located with respect to the element substrate 20 in the thickness direction and the plane direction. Thus, when the forming material for the adhesive layer 33 is applied to the element substrate 20 and the protective substrate 30 is then bonded thereto, it is possible to easily perform the positioning of two substrates only by fitting the protective substrate 30 to the separating member 35 provided on the element substrate 20. Further, according to the present embodiment, since the protective substrate 30 and the element substrate 20 are fitted to each other by the fitting groove (the cut-out portion) 30d, it is possible to more closely adhere the protective substrate 30 to the element substrate 20, thereby improving the mechanical strength of an organic EL device. In addition, it is possible to effectively prevent the permeation of water and oxygen into the organic EL elements 200 by the fitting groove (the cut-out portion) 30d.

Figure 10:
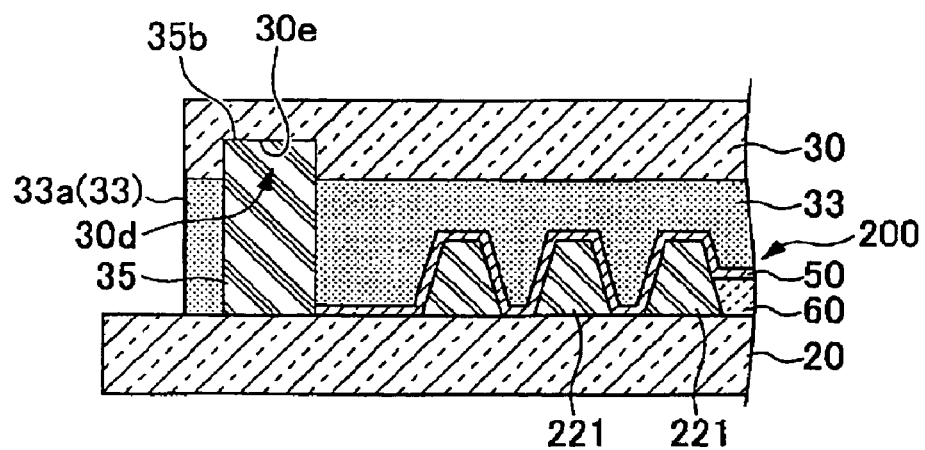
FIG. 10 is a cross-sectional view illustrating the substrate supporting structure according to the fifth embodiment of the present invention.

Moreover, in the organic EL device comprising the protective substrate 30 having the fitting grooves 30d therein, as shown in FIG. 10, a portion of the adhesive layer 33 can be provided at the outside (the side opposite to the organic EL element) of the separating member 35. When the adhesive layer 33a (33) is additionally provided at the outside of the separating member 35, it is possible to effectively prevent the permeation of water and oxygen into the organic EL elements 200, thereby improving the reliability of the organic EL device.

(Electronic Apparatus)

Figure 11:
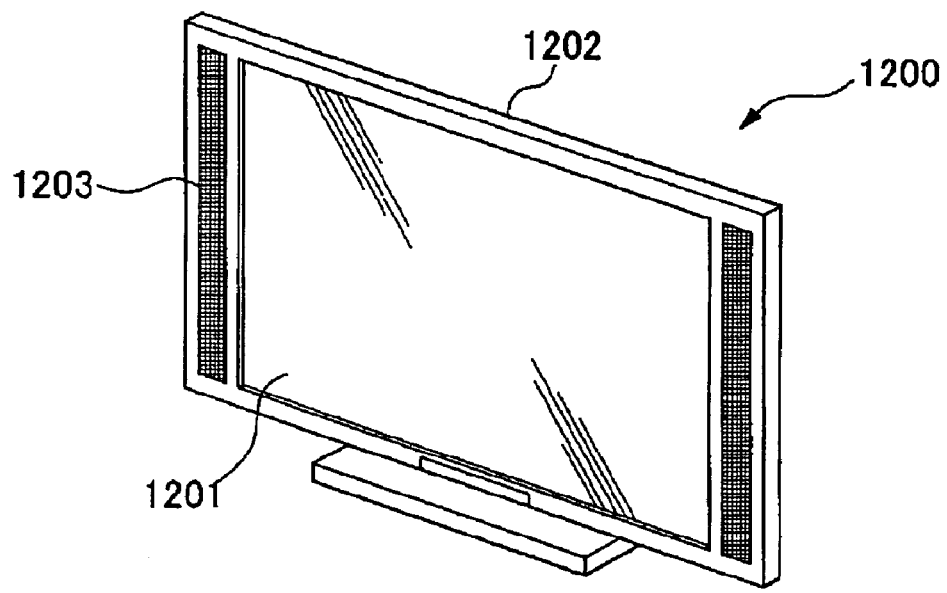
FIG. 11 is a perspective view illustrating an example of an electronic apparatus according to the present invention.

FIG. 11 is a perspective view illustrating the structure of a thin television set 1200 having a large screen as an example of an electronic apparatus according to the present invention. The thin television set 1200 having a large screen shown in FIG. 11 comprises a display unit 1201 composed of the organic EL device according to any one of the above-mentioned embodiments, a case 1202, and a voice output unit 1203, such as a speaker, as the main components. Further, since the thin television set having a large screen is equipped with the organic EL device according to the present invention, it is possible to display an image with uniform brightness, thereby raising the reliability of the display unit.

The organic EL device according to the present invention can be applied to display units of various electronic apparatuses as well as the display unit of the television set shown in FIG. 11. For example, the organic EL device of the present invention can be applied to display units of portable electronic apparatuses, personal computers, and the like.

What is claimed is:

1. An organic electroluminescent device comprising:
    an element substrate having organic EL elements on one surface thereof, the organic EL elements being surrounded by a partitioning member with a first area;
        a protective substrate bonded to the element substrate with an adhesive layer interposed therebetween;
        a protective layer formed between the organic EL elements on the element substrate and the adhesive layer so as to cover the organic EL elements; and
        a separating member provided between the protective substrate and the element substrate for maintaining a predetermined gap therebetween,
        the adhesive layer being in contact with the protective-layer and covering a second area larger than the first area of the partitioning member.

2. The organic electroluminescent device according to claim 1,
    wherein the separating member is provided at the outside of an element forming region in which the organic EL elements are formed.

3. The organic electroluminescent device according to claim 2,
    wherein the separating member is provided between the element forming region and a region in which connecting terminals constituting a portion connecting with an external apparatus are formed.

4. The organic electroluminescent device according to claim 1,
    wherein a fitting structure is provided in a contact portion between the separating member and the protective substrate to restrict the movement of the protective substrate in the plane direction.

5. The organic electroluminescent device according to claim 4,
    wherein the fitting structure comprises a cut-out portion provided in an outer circumferential end portion of the protective substrate and an upper end portion of the separating member fitted to the cut-out portion.

6. The organic electroluminescent device according to claim 4,
    wherein the fitting structure comprises a cut-out portion provided in an upper end portion of the separating member and an edge portion of the protective substrate fitted to the cut-out portion.

7. The organic electroluminescent device according to claim 4,
    wherein the fitting structure comprises a groove provided in a surface of the protective substrate facing the element substrate and an upper end portion of the separating member fitted to the groove.

8. The organic electroluminescent device according to claim 1,
    wherein the separating member is formed substantially in a rectangular frame shape in plan view.

9. The organic electroluminescent device according to claim 1,
    wherein air bubble removing means is provided in the separating member or the protective substrate to prevent the generation of gas bubbles in the adhesive layer when the protective substrate is bonded to the element substrate with the adhesive layer interposed therebetween.

10. The organic electroluminescent device according to claim 9,
    wherein the air bubble removing means is a communicating hole through which the adhesive layer communicates with the outside of the separating member.

11. An electronic apparatus, inside of which is included the organic electroluminescent device according to claim 1.

12. The organic electroluminescent device according to claim 1, the protective layer having a thickness 10 nm to 300 nm.

13. The organic electroluminescent device according to claim 1, the separating member functioning as a bank member for sealing the adhesive layer inside the bank member.

14. The organic electroluminescent device according to claim 1, the separating member having a height of 50 μm to 1 mm.

15. The organic electroluminescent device according to claim 1, the adhesive layer being formed without contacting the element substrate.

16. The organic electroluminescent device according to claim 1, the separating member being made of acryl resin.

17. The organic electroluminescent device according to claim 1, the separating member being made of silicon oxide.

* * * * *